United States Patent [19]

Mastner

[11] 4,296,412
[45] Oct. 20, 1981

[54] METHOD AND APPARATUS FOR SIGNAL TRANSMISSION

[75] Inventor: Jiri Mastner, Niederrohrdorf, Switzerland

[73] Assignee: BBC Brown, Boveri & Company Limited, Baden, Switzerland

[21] Appl. No.: 92,520

[22] Filed: Nov. 8, 1979

[30] Foreign Application Priority Data

Dec. 1, 1978 [CH] Switzerland .................. 12295/78

[51] Int. Cl.$^3$ ................... G08C 19/16; G08C 25/00
[52] U.S. Cl. .................. 340/870.19; 340/870.29; 340/870.43; 328/162; 328/173; 375/26
[58] Field of Search ............ 340/203, 205, 206, 209, 340/187, 186, 188 R, 188 CH, 189 R, 190, 177 R, 870.19, 870.23, 870.24, 870.42, 870.43, 870.27, 870.28, 870.29, 870.81; 375/26, 22, 28, 33, 17, 58–60; 332/9 R, 11 D; 331/182; 328/132, 134, 135, 141, 150, 151, 162, 173, 175; 307/234, 236, 350, 351, 356

[56] References Cited

U.S. PATENT DOCUMENTS

| | | | |
|---|---|---|---|
| 3,173,092 | 3/1965 | Meschi | 375/26 |
| 3,678,413 | 7/1972 | Wakeling | 375/26 |
| 3,927,309 | 12/1975 | Fujiwara et al. | 375/26 |
| 4,151,517 | 4/1979 | Kelley | 375/28 |
| 4,161,628 | 7/1979 | McRea | 328/162 |

FOREIGN PATENT DOCUMENTS 577734  7/1976  Switzerland .................. 340/870.19

OTHER PUBLICATIONS

"Military Standardization Handbook", 9-20-74; Mil-HDBK-217 B, pp. 2.1.1-1, 2.1.5-5, 2.1.7-1, .7-2, .7-11.

*Primary Examiner*—John W. Caldwell, Sr.
*Assistant Examiner*—Donnie Lee Crosland
*Attorney, Agent, or Firm*—Werner W. Kleeman

[57] ABSTRACT

Differential pulse code modulation (DPCM) is used for a fast digital transmission of the analog input signal. In the DPCM modulator, a difference is built between the scaled input signal and the output of a digital/analog converter, which is controlled by a digital integrator. Comparator means generate a DPCM signal with values corresponding to "no change", "up-" or "down-integration" in dependence on the amplitude and polarity of the mentioned difference. The zero-crossings of the input signal itself are detected separately and are converted into a one-bit PCM signal, having the value "reset". The DPCM and PCM signals are combined into a multi-value control signal, which is fed to the integrator and causes it to follow-up the input signal and make a reset at each zero-crossing. The multi-value control signal is coded, transmitted to the receiver side of the link and decoded. The different decoded values control an integrator in the demodulator in the same way, as in the modulator. The input signal is reconstructed by digital integration of the DPCM. The periodical reset of the receiving integrator avoids a dc offset of its output, caused in any conventional DPCM system by the initial conditions of the integrator, by transmission errors, by an offset of the modulator and so forth.

15 Claims, 3 Drawing Figures

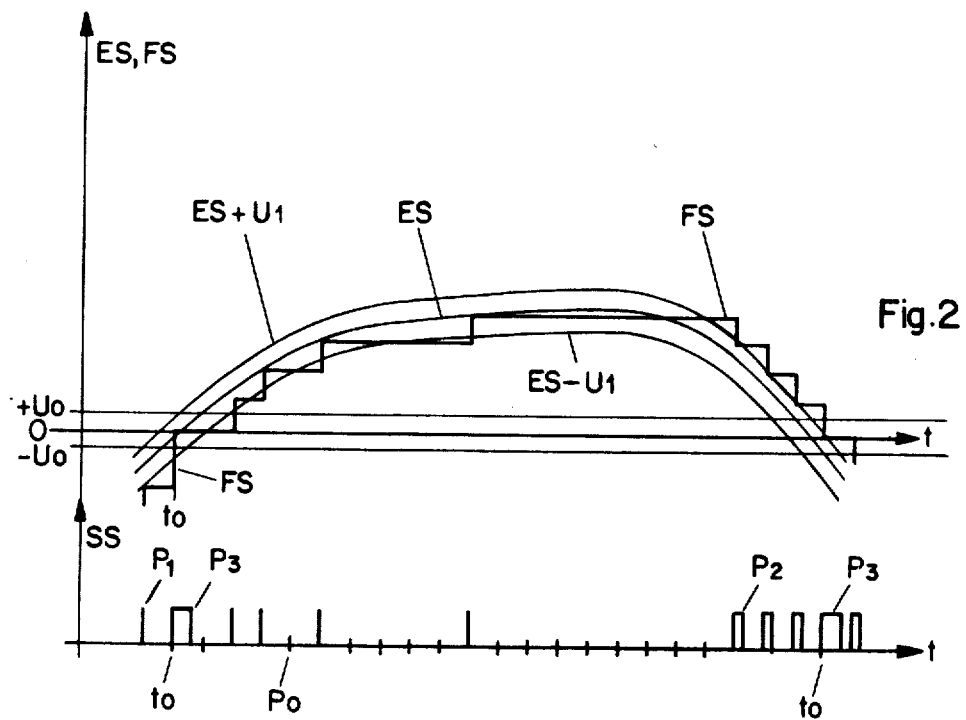
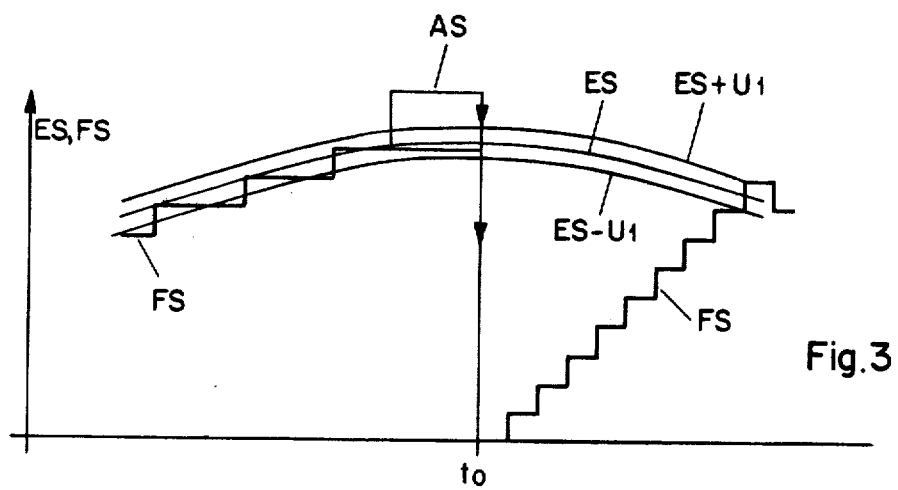

METHOD AND APPARATUS FOR SIGNAL TRANSMISSION

BACKGROUND OF THE INVENTION

The present invention relates to a new and improved method for signal transmission, especially for the transmission of current and voltage measurement signals by a potential bridging-transmission channel with pulse modulated electromagnetic waves, for instance a waveguide. The invention furthermore relates to apparatus for the performance of such method.

Generally speaking, there is disclosed a method for signal transmission, especially for transmitting current and voltage measuring signals by means of a potential bridging-transmission channel containing pulse modulated electromagnetic waves. The input signal is compared with a follow-up signal which follows-up the input signal and a control signal corresponding to the sign of the difference between the input signal and the follow-up signal is transmitted. At the receiver side there is obtained an output signal corresponding to the input signal which is used for controlling an integrating element.

In power or high-current measurement technology efforts have been expended for quite some time to replace the potential bridging function of standard current converters by less complicated solutions. In particular, there should be circumvented the problem of high-voltage insulation between the primary side and the secondary side, leading to appreciable costs and in the case of very high voltages, exceeding 400 kV, also results in fundamental technological difficulties.

While passive solutions, for instance Faraday rotators having optical transmission channels or with microwave transmission have not yet produced satisfactory results, active solutions employing modulators at high potential and measuring value transmission by waveguides (fiber optics), simultaneously ensuring for potential separation and bridging, promise more successful results.

Since it is only possible to reliably accomplish opticl data transmission with data in binary form, the problem is especially concerned with providing suitable conversion of the analog input or measurement signal into a pulse signal which can be optically transmitted and reliably again obtaining the signal at the receiver side. For the actual data transmission there can be used, for instance, pulse-shaped frequency modulation and pulse code modulation or the like. For metering purposes there is required an amplitude accuracy, including null point stability, typically in the order of 0.1 to 0.2 percent of the rated current. Equally, the phase error tyically should not exceed about 0.15 to 0.3 degrees. When working with frequencies of 50 Hz or 60 Hz this requires a real-time measurement and transmission which at most amount to about $8 \div 17$ $\mu$seconds total delay.

For protective purposes the primary emphasis is placed upon extreme dynamics, i.e. a measuring range up to about 1000:1 with reduced requirements as concerns amplitude and phase accuracy, about $\pm 3 \div 5\%$, approximately $\pm 1$ to $\pm 3$ degrees.

Active components of the circuit may be exposed to extreme temperature fluctuations, typically for instance $-25°$ to $+45°$ or more, and extreme electromagnetic operating conditions such as lightening striking, switching operations, short-circuits on the line and so forth. Maintenance and servicing of the modulator at high potentials is extremely difficult and hardly possible without cut-off of the power line. Therefore, there is an absolute requirement of as high as possible reliability of the modulator.

The requirements for amplitude accuracy of a metering current converter can be obtained with an 11 to 12-bit PCM (pulse code modulator). At the high voltage there is used an appropriate A/D (analog-digital converter) with forwardly connected S + H (sample-and-hold circuit). The instantaneous value of the preprocessed signal, typically amplified, attenuated, filtered and so forth, is periodically stored in the sample and hold circuit, thereafter there is carried out an analog-digital conversion, usually based on the successive approximation principle. The data is then serially transmitted by means of the optical fiber guide to the receiver/demodulator. An advantage of this method is the independence of individual measurements and the thus resultant high slew-rate (follow-up speed for rapid changes of the input signal).

On the other hand, the method is associated with a number of drawbacks. It is extremely difficult to obtain the requisite phase accuracy or trueness, meaning small time delays. Of the available 8 to 17 $\mu$seconds already an appreciable part is needed for the acquisition time of the sample-and-hold circuit. The analog-digital conversion and data transmission must be accomplished with extreme bit rates, in other words increased requirements are placed upon the electro-optical transmission channel.

Demodulation must be performed synchronously, and therefore standard clock-extraction at the receiver side of the system is required. In order that after turning-on a currentless line,—all of the bits are equal to null—, the measurement can be initiated without delay, i.e. settling time of the clock-extraction, it is necesary to continuously infeed a sychronization signal which, on the other hand, leads to a further increase of the bit rate to be transmitted.

A sample-and-hold circuit, in its hold mode constitutes an extremely high-ohm circuit sensitive to electromagnetic disturbances. High resolution, rapid analog-digital converters are available at the present time in hybrid circuit technology, but there is to be expected lower reliability than with monolithic circuit design. In this respect reference should be made to Military Standardization Handbook MIL-HDBK-217B.

SUMMARY OF THE INVENTION

Therefore, with the foregoing in mind it is a primary object of the present invention to provide a new and improved method and apparatus for signal transmission which is not afflicted with the aforementioned drawbacks and limitations of the prior art proposals.

Another and more specific object of the present invention aim at providing a novel signal transmission method and apparatus for the performance thereof, affording reliable signal transmission enabling positive winning of an input signal without being affected by disturbance signals, transmission dropout or failure and drift phenomenon.

Now in order to implement these and still further objects of the invention, which will become more readily apparent as the description proceeds, the method of transmitting signals according to the invention contemplates forming a multi-value control signal, two of whose signal values are correlated to both signs of the difference between the input signal and follow-up signal and a third signal value thereof is correlated to not exceeding a predetermined threshold value of the amount of such difference. The output signal is obtained by timewise up-and-down integration of the first and second signal values and by fixedly holding the prevailing integral value at the third value of the control signal. Also, as a function of the occurrence of null positions during the time course of the input signal there is triggered resetting of the follow-up signal to the value null and there is transmitted, to the receiver side, a corresponding reset signal and at that location used for resetting the output signal to null.

As mentioned, the invention is not only concerned with the aforementioned method aspects but also to apparatus for the performance thereof, which apparatus is manifested by the features that at the transmitter end of the system there is provided a comparator delivering a three-value output signal as the control signal. The comparator is connected at its input side with the output side of an input signal transmitter and a follow-up signal transmitter or generator. Of the signal values of the control signal two are correlated in each case to both signs of the difference between the input signal and the follow-up signal and the third signal value is correlated to not exceeding a predetermined threshold value of the amount of such difference. The follow-up signal transmitter or generator is provided with an integrating element or integrator controllable between up and down integration and holding its output signal. The integrating element is operatively connected by an appropriate control input circuit or arrangement with an output arrangement or circuit of the comparator. The input signal transmitter is coupled with a null position detector having an output connected with a resetting or reset input of the integrating element or integrator. A coder is operatively connected in circuit with the outputs of the comparator and the null position detector, the coder having a subsequently arranged transmitter and receiver and decoder with an at least four-value transmission channel and a subsequently arranged, receiver side-integrating element.

The signal is transmitted in multi-value pulse modulation, for instance in a 2-bit DPCM (differential pulse-code-modulation). The null positions of the signal are transmitted in a 1-bit PCM (pulse-code-modulation) having allocated thereto a greater priority than the DPCM (the 1-bit PCM masks the 2-bit DPCM signal).

In DPCM there are only transmitted changes of the signal, positive or negative changes, leading to a reduction of the bit rate to be transmitted. For the reconstruction of the signal at the receiver side or end of the system there must of course be integrated the difference signal. It is a known drawback of all DPCM systems, including delta modulation, that such integrator also integrates disturbances and offset, so that there may be formed a timewise indefinite or, in fact, increasing shifting of the null point, up to the limit of the linear range of the integrator.

By using the higher priority 1-bit PCM it is possible, on the other hand, to carry out at every zero crossing or throughpass of the input signal a reset of the digital integrator at the receiver section. The system therefore operates in a self-correcting mode, and there are overcome the abovementioned drawbacks of DPCM. When the line is turned-off there is continuously transmitted the "null" code and the integrator is maintained at null.

The 3-bit information preferably can be transmitted in the form of pulse width modulation, for instance with binary stepped pulse width of the individual bits, by means of a 1-channel transmission path, to the receiver. In this respect attention is directed to Swiss Pat. No. 577,734 of Otto Lanz, entitled "Verfahren und Einrichtung zur Übertragung electrischer Signale", roughly translated: (Method and Apparatus For Transmitting Electrical Signals).

Since the decoding of the pulse width modulation occurs asynchronously, it is also possible for the entire measurement value transmission to occur asynchronously. Hence, there is dispensed with clock-extraction at the receiver section.

BRIEF DESCRIPTION OF THE DRAWINGS

The invention will be better understood and objects other than those set forth above will become apparent when consideration is given to the following detailed description thereof. Such description makes reference to the annexed drawings wherein:

FIGS. 2 and 3 illustrate graphs of the input signal ES, the follow-up signal FS, the control signal SS and the output signal AS as a function of time t.

DETAILED DESCRIPTION OF THE PREFERRED EMBODIMENTS

Figure 1:
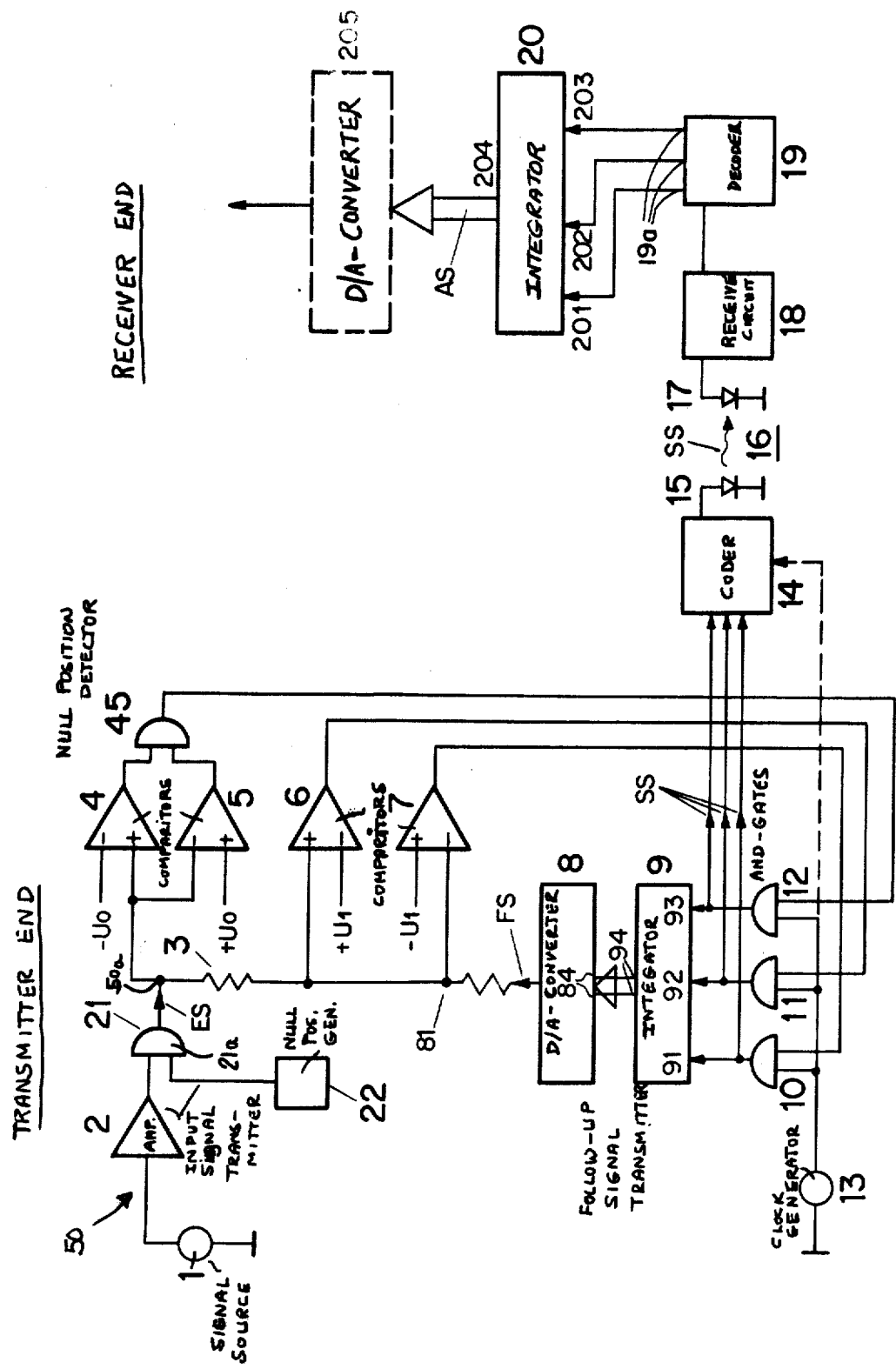
FIG. 1 is a simplified principal signal block circuit diagram of a possible construction of modulator according to the invention.

Describing now the drawings, with the circuit arrangement shown in FIG. 1 an input signal transmitter or generator 50 composed of an amplifier 2 and null position transmitter or generator 21, consisting of an analog-blocking switch 21a and provided with a null position generator 22 is connected with a signal source 1 which delivers the input signal ES. The output side 50a of the input signal transmitter 50 is coupled by means of a summation resistor 3 with output 81 of a digital-analog converter 8. With bipolar input signal the digital-analog converter 8 is a bipolar digital-analog converter. The digital input or input side 84 of the digital-analog converter 8 is connected with the output or output side 94 of a multi-stage forward-backward or up-down counter 9, which controls the digital-analog converter 8.

Comparators or comparator means 6 and 7 monitor the signal equilibrium at the output 81 of the digital-analog converter 8. If the input signal ES changes, and thus, if the difference at the output 81 exceeds the threshold of the dead zone of $\pm U_1$ (typically $|U_1| - <|LSB|$, e.g. LSB/2) then the corresponding comparator responds, and by AND-compounding at the AND-gates 10 and 11 enables infeed of the next clock pulse from the clock generator 13 to the forward and backward counting inputs 91 and 92 of the counter 9. The polarity is chosen such that due to the counting operation the potential difference at the output 81 is reduced. In the foregoing the designation "LSB" means least significant bit.

If the input signal crosses the null line, then the output signal of the amplifier 2 drops into the null window $\pm U_O$ (typically $|U_O| < |LSB|$ of the signal) of the window discriminator constituted by the comparators 4, 5 and the AND-circuit or gate 45. By means of AND-compounding circuit or gate 12 there is infed a clock pulse to the reset input 93 of the counter 9, and both the counter 9 and the digital-analog converter 8 are reset to null.

The forward and backward counting pulses and the reset pulse are simultaneously also delivered to a pulse coder 14, for instance a pulse width modulator. The coded output is infed by means of a transmitter or sender 15, in the embodiment under discussion assumed to be constituted by a LED, a transmission line 16, for instance a fiber optical light guide or waveguide and a detector 17, for instance a photodetector, to a receiver 18 and decoder 19.

At the outputs 19a of the decoder 19 there are again reconstructed three signals which are infed in the same significance and correlation to the forward and backward counter inputs 201 and 202 and the reset input 203 of the multi-state forward-backward counter 20.

Both counters 9 and 20 work in parallel and at the outputs 204 of the counter 20 there appears the same bit-combination as at the digital-analog converter input 84.

For reconstruction of the analog signal from the signal source 1 it is possible for the output 204 to supply the digital input of a second digital-analog converter 205.

According to a practical construction there is required a complicated structure of the logic circuitry. Thus, for instance, there are used D-flip-flops as intermediate storages between the outputs of the comparators 6, 7 and the AND-circuit 45 and the inputs of the circuit components 10, 11 and 12, controlled by a multiphase clock generator 13. An additional logic circuit is provided to prevent an overflow of both counters upon exceeding the signal maximum value in both directions. The pulse coder 14 is preferably coupled with a clock generator 13. Since however these additional circuit configurations correspond to known technology there is no need to further discuss the same.

As the digital-analog converters 8 and 205 there can be used linear digital-analog converters, but there also can be employed compounding digital-analog converters, for instance for protective purposes.

For accurate transmission of direct-current signals or signals which infrequently cross the null line or not at all, it is possible to derive from a timer or clock a periodic reset signal, for instance as a replacement or addition to the output of AND-gate 45, enabling periodic calibration of the null point.

The maximum slew-rate, i.e., follow-up speed for a timewise varying signal, is limited by the clock frequency and the resolution, in other words magnitude of the least significant bit. This property can be utilized, with proper dimensioning, for suppressing brief disturbances.

If the slope of the signal rise exceeds the maximum slew-rate of the system, known as slope-overload in the case of delta modulation, then, depending upon the polarity of the signal derivation, there exists a continuous sequence of forward or backward counter pulses, with one respective pulse for each clock period. This can be easily detected at the receiver side or end of the system and employed as an early warning that presumably there will be exceeded the measuring range. Thus, for instance, in the case of multi-channel systems with stepped measuring range this slope-overload signal can be used as a command for switching to a channel having greater measuring range.

The same modulation technique also can be employed for the signal transmission of voltage signals of capacitive voltage converters.

If the measuring signal source itself has an undesired temperature dependency, then this can be compensated by using an appropriate temperture-dependent reference voltage for the digital-analog converter 8.

FIG. 2 shows the time course of the input signal ES and the threshold curves $ES + U_1$ and $ES - U_1$ within which there lies the neutral zone of the comparator formed by the elements 6 and 7. Upon falling below $ES - U_1$ and upon exceeding $ES + U_1$ there follows in each case a forward or up counter pulse as the value $P_1$ and a backward or down counter pulse as the value $P_2$ of the control signal SS, whereas with a position of the follow-up signal FS within the neutral zone at the corresponding clock time there occurs a standstill signal $P_0$, here for instance the value null of the control signal SS. After occurrence of the input signal ES in the threshold value zone governed by $+U_o$ and $-U_o$ there occurs a counter-null position or reset signal in the form of the value $P_3$ of the control signal SS, for instance in FIG. 2 at the time $T_o$. There is assumed a pulse width modulation of the control signal. FIG. 3 furthermore shows an input signal ES without null throughpass or crossover, wherein with the aid of the null position generator shown in FIG. 1 at the time $t_0$ there is forced a counter null position or reset operation. As a result there also disappears any assumed disturbance deviations of the output signal AS. Thereafter, the follow-up signal FS and thus the output signal AS again moves from both sides into the neutral zone. In FIG. 3, for the sake of simplicity, there has been shown uninterrupted the course of the input signal ES. A corresponding effect also can be obtained by a resetting element provided in the counter control.

While there are shown and described present preferred embodiments of the invention, it is to be distinctly understood that the invention is not limited thereto, but may be otherwise variously embodied and practiced within the scope of the following claims.
ACCORDINGLY,

What I claim is:

1. A method of transmitting signals between the transmitter end and receiver end of a transmission system, especially for transmitting current and voltage measurement signals by a potential bridging-transmission channel with pulse modulated electromagnetic waves, comprising the steps of:

comparing at the transmitter end an input signal with a follow-up signal which follows the input signal;

generating a control signal derived from the difference between the input signal and the follow-up signal;

forming as the control signal a multi-value control signal having different signal values;

correlating two signal values to both signs of the difference between the input signal and the follow-up signal;

correlating a third signal value to not exceeding a predetermined threshold value of the magnitude of such difference;

transmitting the control signal to the receiver end;

utilizing the control signal at the receiver end for obtaining an output signal corresponding to the received signal by controlling an integrating element;

obtaining the output signal by timewise up-and-down integration at the first and second values and by fixedly holding the existing integrated value at the third value of the control signal;

triggering resetting of the follow-up signal to the value null as a function of the occurrence of null positions during the time course of the input signal;

transmitting a corresponding resetting signal to the receiver end; and employing the resetting signal at the receiver end for resetting the output signal to null.

2. The method as defined in claim 1, further including the steps of:

impressing at the input signal null positions for an additional resetting of the integrated follow-up signal.

3. The method as defined in claim 1, further including the steps of:

using for at least two values of the control signal to be transmitted different pulse widths.

4. The method as defined in claim 3, further including the steps of:

using an additional different pulse width for the transmission of the resetting signal.

5. The method as defined in claim 4, further including the steps of:

using the amplitude null as the value of the control signal correlated for fixing the integrated value.

6. The method as defined in claim 3, further including the steps of:

using the amplitude null as the value of the control signal correlated for fixing the integral value.

7. An apparatus for transmitting signals between a transmitter end and receiver end of a transmission system, especially for the transmission of control and voltage measuring signals, comprising:

input signal transmitter means having an input side and an output side;

signal source means connected with the input side of said input signal transmitter means;

follow-up signal generator means connected in circut with the output side of said input signal transmitter means for delivering a follow-up signal;

comparator means having an input side connected with the output side of said input signal transmitter means and with the follow-up signal generator means;

said comparator means delivering a three-value output signal as a control signal;

two of the signal values of the output signal being correlated with both signs of the difference between the input signal and the follow-up signal;

the third value of the output signal being correlated with non-exceeding of a predetermined threshold value of the magnitude of such difference;

said follow-up signal generator means including a controllable integrating element;

a control input arrangement provided for said controllable integrating element, said controllable integrating element being operatively connected by means of the control input arrangement with the output side of the comparator means;

said controllable integrating element being controllable between up-and-down integration and for fixedly holding its output signal;

a null position detector having an output side;

said integrating element having a resetting input;

the output side of the null position detector being connected with the resetting input of the integrating element;

said input signal transmitter means being connected with the null position detector;

coding means operatively connected with said comparator means and said null position detector;

transmitter means arranged after said coding means;

receiver means;

decoding means having at least one four-value transmission channel connected with said receiver means; and a receiver end-integrating element arranged after the transmission channel.

8. The apparatus as defined in claim 7, wherein:

said integrating element is selectively arranged at the transmitter end or receiver end of the system and constituting a forward-backward counter with null resetting.

9. The apparatus as defined in claim 7, wherein:

said comparator means has a neutral zone correlated to fixedly holding the follow-up signal value.

10. The apparatus as defined in claim 9, wherein:

said integrating element is selectively arranged at the transmitter end or receiver end of the system and constituting a forward-backward counter with null resetting.

11. The apparatus as defined in claim 8, wherein:

said follow-up signal generator means comprises a digital-analog converter arranged after the output side of the forward-backward counter.

12. The apparatus as defined in claim 7, wherein:

said coder means is operatively connected at its input side with said control input arrangement of the integrating element.

13. The apparatus as defined in claim 7, further including:

a separately controllable null position transmitter.

14. The apparatus as defined in claim 7, wherein:

said coder means comprises a pulse width modulator.

15. The apparatus as defined in claim 7, wherein:

said decoder means comprises a pulse width demodulator.

* * * * *